United States Patent [19]

Yamamoto et al.

[11] Patent Number: 5,056,145
[45] Date of Patent: Oct. 8, 1991

[54] DIGITAL SOUND DATA STORING DEVICE

[75] Inventors: Takaharu Yamamoto; Syuzi Hashiba; Toshimitsu Imai, all of Nagoya, Japan

[73] Assignee: Kabushiki Kaisha Toshiba, Kawasaki, Japan

[21] Appl. No.: 469,810

[22] Filed: Jan. 22, 1990

Related U.S. Application Data

[63] Continuation of Ser. No. 199,333, May 26, 1988, abandoned.

[30] Foreign Application Priority Data

| Jun. 3, 1987 | [JP] | Japan | 62-139505 |
| Jun. 4, 1987 | [JP] | Japan | 62-140567 |
| Jun. 5, 1987 | [JP] | Japan | 62-140916 |
| Jun. 5, 1987 | [JP] | Japan | 62-140918 |

[51] Int. Cl.$^5$ .................. G09B 19/04; G09B 19/06; G10L 3/00
[52] U.S. Cl. .................. 381/51; 434/167; 434/157; 434/185; 364/513.5
[58] Field of Search .............. 364/513.5, 419; 381/51-53; 434/156, 157, 159, 167, 169, 185

[56] References Cited

U.S. PATENT DOCUMENTS

| 4,384,169 | 5/1983 | Mozer et al. | 381/31 |
| 4,384,170 | 5/1983 | Mozer et al. | 381/51 |
| 4,389,541 | 6/1983 | Nakano et al. | 381/51 |
| 4,489,396 | 12/1984 | Hashimoto et al. | 434/167 |
| 4,500,971 | 2/1985 | Futaki et al. | 364/513.5 |
| 4,615,680 | 10/1986 | Tomatis | 434/185 |
| 4,630,222 | 12/1986 | Yoshida et al. | 364/513.5 |
| 4,630,235 | 12/1986 | Hashimoto et al. | 434/157 |
| 4,669,121 | 5/1987 | Shigehara et al. | 381/51 |
| 4,786,255 | 11/1988 | Hiramatsu et al. | 434/157 |
| 4,791,587 | 12/1988 | Doi | 434/157 |

Primary Examiner—Dale M. Shaw
Assistant Examiner—David D. Knepper
Attorney, Agent, or Firm—Foley & Lardner

[57] ABSTRACT

This invention relates to a digital sound data storing device wherein analog sound data is synthesized from digital sound data. The device includes a case and an IC card detachably attached to the case. A plurality of digitized sound data groups are stored at a built-in memory of the IC card. The digitized sound data groups are obtained by recording sentences for foreign language conversation practice through a microphone to thereby obtain analog sound signal which is converted to digital sound signal. When the IC card is attached to the case, a signal processing circuit operates to read out the digital sound data group, which is converted to the analog sound signal. The analog sound signal is supplied to an amplifying circuit and reproduced as sound.

5 Claims, 3 Drawing Sheets

| Address | |
|---|---|
| 00000 | First speech data store start address XXXXX |
| | Second speech data store start address YYYYY |
| | N-th speech data store start address ZZZZZ |
| XXXXX | First speech data |
| YYYYY-1 | End of the first speech data |
| YYYYY | Second speech data |
| ZZZZZ-1 | End of the (n-1)th speech data |
| ZZZZZ | N-th speech data |

Fig. 3

DIGITAL SOUND DATA STORING DEVICE

This application is a continuation of application Ser. No. 07/199,333, filed May 26, 1988, now abandoned.

BACKGROUND OF THE INVENTION

1. Field of the Invention

The present invention relates to a sound data storing device wherein sound is reproduced based on digitized sound data stored therein and which is portable and especially suitable for language speaking practice, musical training or the like.

2. Description of the Prior Art

Cassette tape recorders have been used as the above-mentioned portable sound data storing device suitable for the language speaking practice, musical training or the like. In the cassette tape recorders, for example, analog human speech signals are magnetically recorded on a magnetic tape taken up in a case. Speech signals are read out by running the magnetic tape with the tape coming into contact with a magnetic head, thereby reproducing speech. The cassette tape recorder is useful in continuously reproducing the speech or sound data groups recorded throughout the tape. However, when a part of the speech groups is reproduced or when reproduction of a particular speech group is repeated, a user or learner is forced into the troublesome operations of quickly running the tape forward and backward to thereby search the part desired to be reproduced. In view of the above-described difficulties, the prior art has provided for an improved sound data storing device for the language speaking practice, especially. Such an improved language speaking trainer comprises a plurality of magnetic cards in each of which analog speech data corresponding to one sentence is magnetically recorded, and a reproduction control unit to which any one of the magnetic cards is selectively attached. In the reproduction control unit, the magnetic card is moved to come into contact with a magnetic head, which reads out the speech data recorded on the magnetic card. The speech data read out by the magnetic head is transferred to an internal storage means. The reproduction control unit is designed so as to reiteratively output the reproduced speech corresponding to the speech data stored at the internal storage means.

The above-described improved language speaking trainer reduces the need for the troublesome operation of searching the head portion of the speech data, which operation being required in the tape recorder in the case of repeating the reproduction of the same speech. However, since the magnetic card can only record a speech data corresponding to a relatively short sentence per card owing to its small recording capacity, a plurality of magnetic cards need to be carried for the purpose of practicing a conversation situation in which a plurality of sentences are required. Accordingly, practical use of the prior art language speaking trainer results in much inconvenience. Furthermore, the magnetic cards need to be frequently exchanged and transmission of the speech data from the magnetic card to the internal storage means requires much time. These disadvantages also result in inconvenience. Furthermore, since the magnetic card is fed against the magnetic head when the speech data is transmitted from the card to the internal storage means, the prior art language speaking trainer requires a card feeding mechanism comprising movable members such as a motor and flywheel and the magnetic head, which mechanism complicates construction of the device and results in an increase in the occurrence of failures. The prior art language speaking trainer thus has a problem of reliability on the life. Furthermore, since the card feeding mechanism requires a relatively large amount electrical power, the prior art trainer is not desirable in the continuous use when storage batteries are employed as the power source. The use of a storage battery having a large capacity increases the net weight of the trainer results in a problem of portability of the same. Since the card feeding mechanism is relatively heavy, the problem of portability becomes more acute, particularly. Moreover, since the magnetic card is likely to be influenced by magnetic fields, the user is required to take care of the magnetic card so that it is kept away from a magnet. The magnetic card is thus not desirable on the point of so-called fool-proofing.

SUMMARY OF THE INVENTION

Therefore, a primary object of the present invention is to provide a digital sound data storing device wherein the portability and usability may be improved with improvement of reliability and wherein language speaking practice or musical training may be efficiently executed.

A second object of this invention is to provide a digital speech data storing device wherein the comparative practice of more than two languages may be efficiently executed.

A third object of this invention is to provide a digital sound data storing device wherein data of sound uttered by the user may be compared with a prestored model sound data easily and quickly.

In order to attain the primary object, the digital sound data storing device of this invention comprises a case and a card-shaped external storage unit detachably attached to the case. The external storage unit is provided with a built-in IC memory wherein a plurality of digitized sound data groups corresponding to a plurality of sound groups are stored. The case encloses a reproduction unit comprising a signal processing circuit synthesizing an analog sound signal from the sound data read out from the IC memory of the external storage unit attached to the case, an amplifying circuit amplifying the analog sound signal synthesized by the signal processing circuit, and output means for outputting sound based on the analog sound signal amplified by the amplifying circuit. A plurality of sound data groups stored at the IC memory of the external storage unit may be selectively reproduced. Since the digital sound data storing device of this invention denecessitates provision of a mechanism including movable members such as a motor, reliability of the device may be improved and the weight of the device may be reduced.

In order to attain the second object, the digital speech data storing device comprises an external storage unit provided with an IC memory storing a plurality of digitized speech data groups corresponding to a plurality of speech groups of each of at least more than two languages. The digital speech data storing device of this invention permits comparative practice of two or more languages (a mother tongue and a foreign language, for example) with high efficiency.

In order to attain the third object, the digital sound data storing device of this invention comprises a case and a card-shaped external storage unit detachably attached to the case. The external storage unit is identical with either of the units constructed to attain the first and second objects. The case encloses a reproduction unit comprising a microphone through which sound is recorded, a built-in memory capable of storing digitized sound data groups, and a signal switching circuit selectively connecting the signal processing circuit to either the internal IC memory or the external IC memory of the external storage unit attached to the case. The signal processing circuit functions to convert the sound inputted through the microphone to digital speech data to thereby store the same at either the internal IC memory or the external IC memory of the external storage unit and to synthesize an analog sound signal from the digital sound data read out from either one of the IC memories. The digital sound data storing device of this invention permits selective reproduction of sound such as speech uttered by the learner, the data of which is stored at the internal IC memory and the model sound data prestored at the IC memory of the external storage unit, thereby being capable of comparing the speech of the learner with the model speech data.

Other and further objects of the present invention will become obvious upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

In the accompanying drawings:

FIG. 3 illustrates an address map of the IC memory of the external storage unit;

DESCRIPTION OF THE PREFERRED EMBODIMENTS

Figure 1:
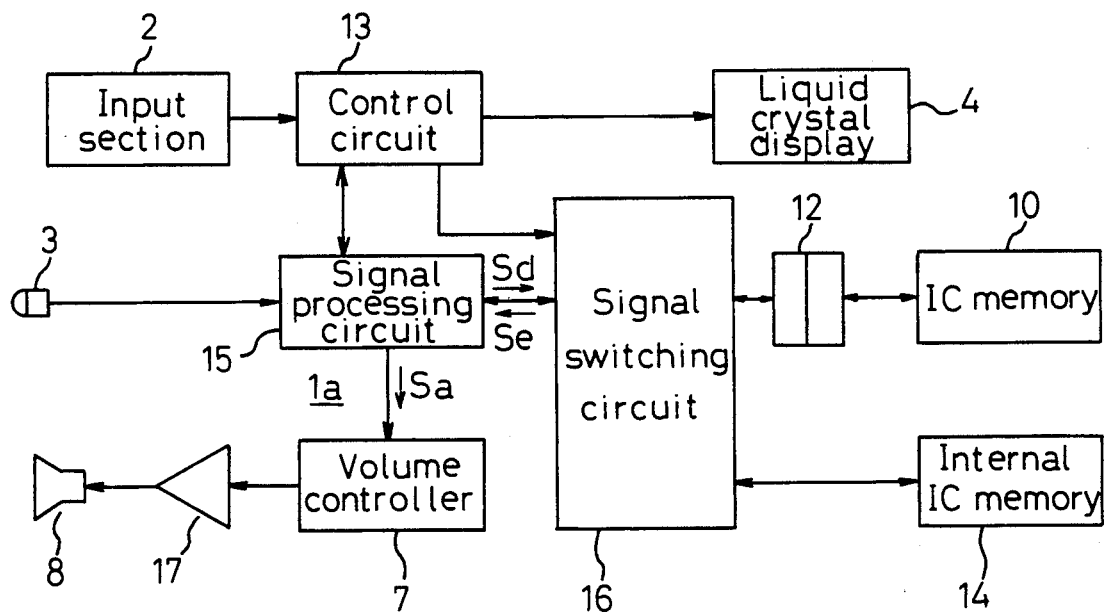
FIG. 1 is a block diagram illustrating the electrical arrangement of a first embodiment of the digital sound data storing device in accordance with this invention.

A first embodiment in which the invention is applied to a language speaking trainer will be described with referrence to FIGS. 1–3. Referring first to FIG. 2 showing an overall appearance of the language speaking trainer, a case 1 encloses a reproduction unit 1a which will hereinafter be described. The case 1 has a front side on which an input section 2 including a plurality of operation switches such as push buttons 2a, a built-in microphone 3, and a liquid crystal display (LCD) 4 as a display means. As viewed in FIG. 2, a card insertion opening 5 is formed in the upper side of the case 1 and an earphone jack 6 is also provided on the upper side thereof. A volume control knob 7a of a volume controller or variable resistor 7 is provided on the left side of the case 1, as viewed in FIG. 2. Reference numeral 8 indicates an earphone as output means connected to the earphone jack 6 through a plug 8a.

An integrated circuit (IC) card 9 serving as an external storage unit is insertable into and detachable from the card insertion opening 5. The IC card 9 includes an IC memory for read only use or a programmable read only memory (PROM), a random access memory (RAM), a central processing unit (CPU) chip for controlling the PROM and RAM, a backup power supply comprising a small-sized or miniature battery, and the like, each embedded in therein neither shown. The IC memory 10 stores a plurality of digitized speech data groups corresponding to a plurality of speech groups of a given foreign language. The speech data groups are assigned addresses as shown in FIG. 3, for example. These digitized speech data groups are obtained, for example, by reading sentences of the foreign language and recording speech groups through a microphone, thereby obtaining analog speech signals which are converted to digital speech signals by a conventional digitizing means. FIG. 3 shows that n digitized speech data groups corresponding to n sentences of the foreign language are stored at the IC memory 10. With reference to FIG. 3, initial memory addresses of n number of speech data groups corresponding to first to n-th short sentences are stored at predetermined areas of the IC memory 10 starting with address (00000). The digital speech data groups are stored at the other areas of the IC memory 10 in the unit of a group. Each initial memory address serves as speech identification data for which any one of "n" number of speech data is selected. A plurality of contacts 11 for use in signal input and output are provided on a side of the IC card 9. When the IC card 9 is inserted in the card insertion opening 5, the contacts 11 are connected to a connector 12 provided within the case 1.

Figure 2:
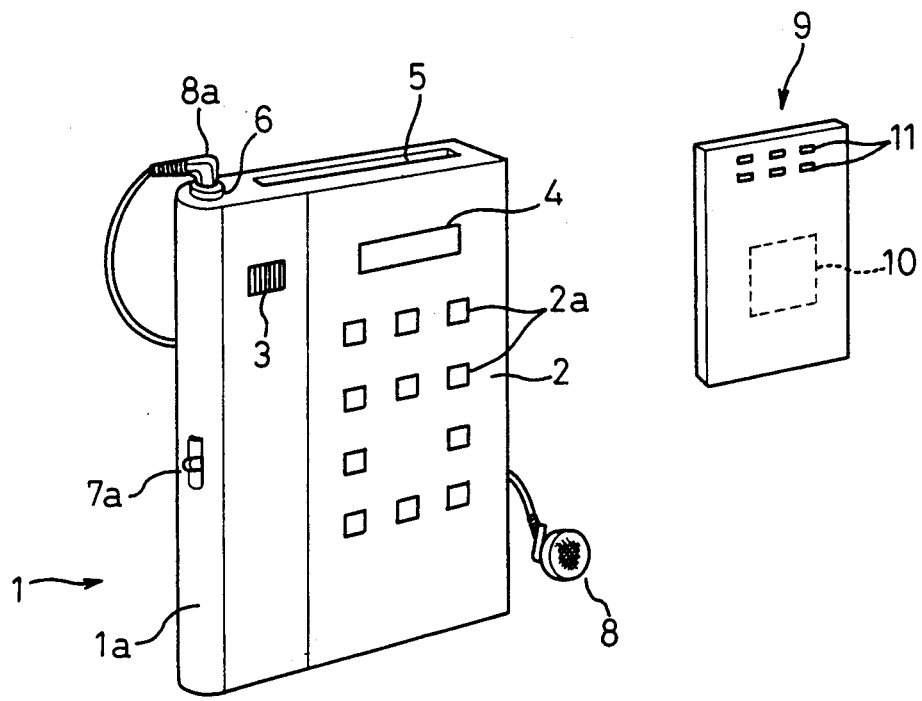
FIG. 2 is a perspective view illustrating the digital sound data storing device with the external storage unit is detached from the case.

Referring now to FIG. 1 showing an electrical arrangement of the device, a control circuit 13 includes a microcomputer. An internal IC memory 14 serves as a RAM. A signal processing circuit 15 comprises a digital-to-analog (D/A) converter and an analog-to-digital (A/D) converter. A signal switching circuit 16 has a data selecting function of alternatively selecting a first state under which data is transmitted between the signal processing circuit 15 and the external IC memory 10 of the IC card 9 through the connector 12 or a second state under which data is transmitted between the signal processing circuit 15 and the internal IC memory 14. The switching of the states can be executed by the control circuit 13. The signal processing circuit 15 alternatively performs an A/D conversion operation of converting analog speech signal inputted through the microphone 3 to digital speech data Sd or a D/A conversion operation of reading out the speech data designated by the control circuit 13 from either the external IC memory 10 or internal IC memory 14 and synthesizing an analog speech signal Sa based on the digitized speech data Se read out. Such a D/A conversion operation is well known in audio response techniques in computer-controlled apparatus. Upon completion of the D/A conversion operation, the signal processing circuit 15 produces an end signal which is supplied to the control circuit 13 in a feedback manner. In accordance with instructions inputted by the user at the input section 2, prestored control program, and data transmission to and from a built-in memory circuit (not shown), the control circuit 13 performs control over the LCD 4, the signal processing cirucit 15 and the signal switching circuit 16, and control of addresses of the IC memories 10 and 14 in the manner described hereinafter.

Reference numeral 17 indicates an amplifying circuit amplifying the analog speech signal Sa supplied from the signal processing circuit 15, thereby supplying the amplified signal Sa to the earphone 8 through the volume controller 7. Accordingly, when the analog speech signal Sa is produced by the signal processing circuit 15, the reproduced speech corresponding to the speech signal Sa is outputted from the earphone 8. The volume may be controlled by the volume controller 7 with the knob 7a.

The control operation of the control circuit 13 will now be described together with overall operation of the language speaking trainer.

1) The recording of speech

In the case of recording speech, either of the IC memories 10, 14 is selected by operation of the input section 2 so that the speech data is stored at the IC memory 10 selected. When the selection is made, the control circuit 13 controls the signal switching circuit 16 so that the circuit 16 is in either the first or second state, based on the instruction inputted at the input section 2. Upon receipt of the recording instruction from the input section 2, the control circuit 13 switches the signal processing circuit 15 so that the A/D conversion operation may be executed. The control circuit 13 further executes an operation to obtain data of a recording time period based on the data stored at either the IC memory 10 or 14 and the recording time period data obtained is displayed by the LCD 4. In this case, alternatively, data of the ratio of the recording time period to the allowed maximum recording time period may be displayed by the LCD 4. In the state of condition described above, when speech is inputted through the microphone 3, the signal processing circuit 15 operates to convert the speech inputted to the digital speech data Sd, which is stored at a location of either the IC memory 10 or 14 selected as described above, the location being assigned a predetermined address. The speech is thus recorded. The control circuit 13 again performs the operation to find a recording time period in accordance with the recorded data and changes the content displayed by the LCD 4 to a newly obtained data.

2) Reproduction of speech data stored at each of the IC memories 10, 14

Of digital speech data groups stored at each memory 10, 14, speech data desired to be reproduced is selected by operation of the input section 2. When such selection is made, the control circuit 13 operates to change the signal processing circuit 15 to either first or second state, based on the instruction supplied from the input section 2. Data of the title of the speech data selected in accrdance with the change of states is displayed by the LCD 4. The title of speech data is specified by a key word appearing in the sentence corresponding to the selected speech data.

Upon receipt of the reproduction instruction from the input section 2, the control circuit 13 operates to change the states of the signal processing circuit 15 so that the D/A conversion operation may be performed. In accordance with the change of the states, the signal processing circuit 15 reads out the speech data selected as described above out of the speech data groups stored at the IC memories 10 and 14. The signal processing circuit 15 operates to convert the digital speech data Se to analog speech signal, which is supplied to the amplifying circuit 17. Thus, the speech is reproduced from the earphone 8. Upon completion of output of the speech, the control circuit 13 operates to repeat output of the speech by the number of times previously set by operation of the input section 2.

According to the above-described first embodiment, a plurality of speech data groups corresponding to a plurality of short sentences of a foreign language and previously stored at the IC card 9 and the speech data recorded by the user may be selectively reproduced by the desired number of times. Consequently, hearing and speaking practices may be efficiently done. Since the IC card 9 storing a plurality of speech data groups is employed for reproduction of speech, the carrying of one or several IC cards 9 makes possible the practice of hearing many sentences. As a result, the portability of the device may be improved and the device may be suitable for practical use. Furthermore, since the speech uttered by the learner can be recorded, both of speaking and hearing practices may be done, thereby improving the language studying efficiency. Since the speech data is read out from the IC card 9 more quickly than in the prior art trainer employing a magnetic card, the sentence desired by the learner may be quickly reproduced, thereby improving the usability of the device. Furthermore, since the IC memory 10 of the IC card 9 employs the direct access method, the IC card 9 denecessitates complicated mechanism as employed in the prior art. Thus, the failure occurrence rate may be reduced and the electrical power consumed and the weight of the device may be decreased. Consequently, the reliability of the device may be enhanced. Furthermore, the continuous use period of the device may be lengthened when the device is supplied with electrical power from the batteries for the purpose of carrying it, and the portability of the device may be improved. Since the learner or user need not take into account destruction of speech data stored at the IC memory 8 of the IC card 9 owing to magnetic force, the user may handle the IC card 9 with ease.

Although the language speaking trainer described above is provided with a speech recording function, such a function may be provided in case of need. Although the IC memory 10 stores the speech data groups corresponding to the short sentences of a foreign language for the purpose of practicing conversation, sound data groups corresponding to musical sound or the like may be stored at the IC memory, instead. For example, by storing data of background music of songs, the digital speech data storing device of this invention may be applied to a music training apparatus. Furthermore, when data of song of birds is stored at the IC memory, the device may be used for deciding about the identity of birds in the case of bird watching.

A second embodiment will now be described with reference to FIGS. 4 and 5. The language speaking trainer of the second embodiment is not provided with the recording function which is equipped with the trainer of the first embodiment. The language speaking trainer of the second embodiment also differs from that of the foregoing embodiment in the construction of the IC card 9 as external storage unit, the signal processing circuit 15, and the control circuit 13. Accordingly, the identical parts are labelled by the same reference numerals as in the first embodiment and those identical parts will not be described in detail.

Figure 4:
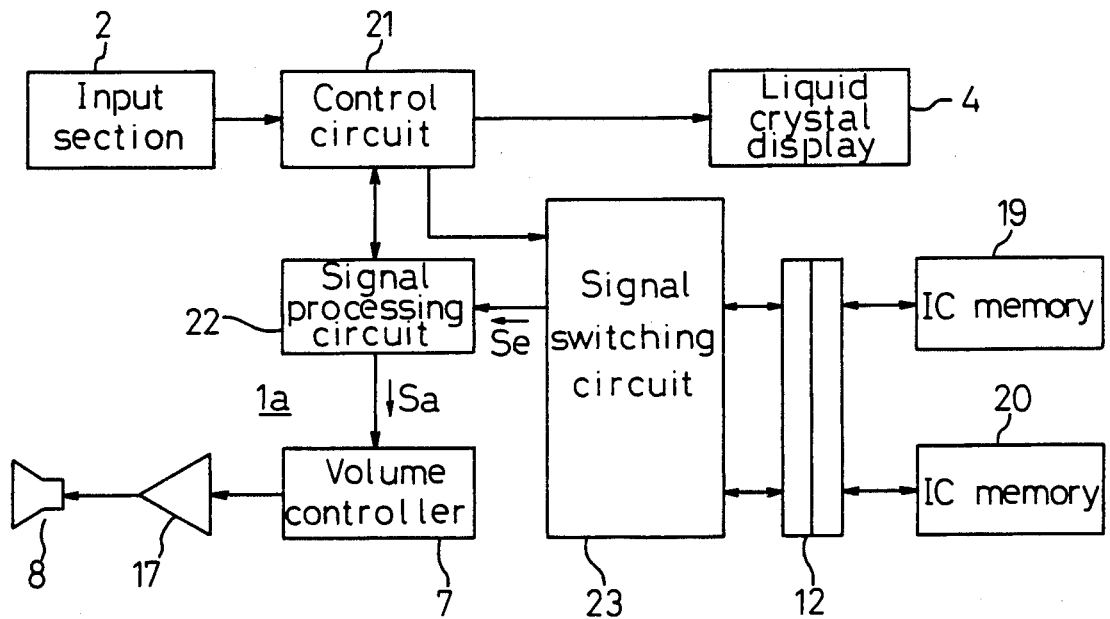
FIG. 4 is a view similar to FIG. 1 illustrating the language speaking trainer of a second embodiment.
Figure 5:
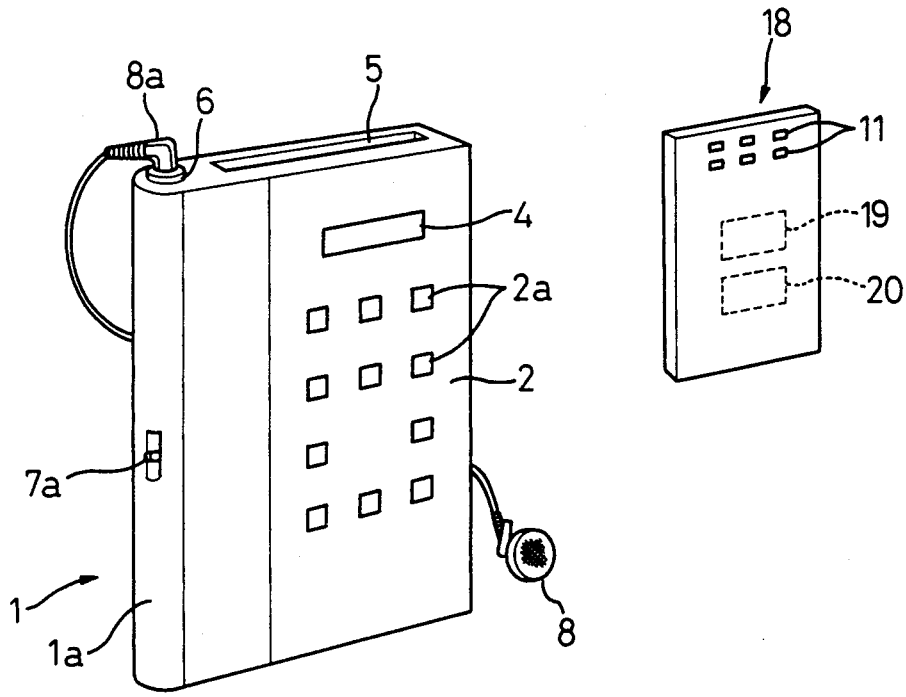
FIG. 5 is a view similar to FIG. 2 illustrating the language speaking trainer of the second embodiment.

Referring to FIG. 4, the microphone 3 is eliminated from the case 1a. Reference numeral 18 indicates an IC card as an external storage unit which is insertable into and detachable from the card insertion opening 5. The IC card 18 comprises two IC memories 19 and 20 each including a PROM, and a CPU chip (not shown) for controlling the IC memories 19 and 20, all of which are embedded in the IC card 18. The IC memories 19 and 20 store a plurality of digitized speech data groups corresponding to a plurality of sentences of the mother tongue and a foreign language, respectively. Contents of addresses of the respective IC memories 19 and 20 are shown by FIG. 3. The digitized speech data groups are obtained by recording the short sentences of the foreign language and of the mother tongue corresponding to those of the foreign language through a microphone, thereby converting analog speech signals to digital speech signals by conventional speech digitizing means.

Referring to FIG. 4, the control circuit 21 comprises a microcomputer. The signal switching circuit 22 comprises a D/A converter. The signal processing circuit 23 is provided with a data selecting function of alternatively selecting a first state wherein data is transmitted between the signal processing circuit 22 and the IC memory 19 of the IC card 18 through the connector 12 or a second state wherein data is transmitted between the signal processing circuit 22 and the IC memory 20 of the IC card 18. The control circuit 21 performs the switching of these states of the signal switching circuit 23. The signal processing circuit 22 is arranged to read out speech data designated by the control circuit 21 from each of the IC memories 19 and 20, thereby synthesizing analog speech signals sa based on the digitized speech data Se. Upon completion of the D/A conversion operation, the signal processing circuit 22 produces and end signal which is supplied to the control circuit 21 in the feedback manner. The control circuit 21 executes control over the LCD 4, the signal processing circuit 22 and the signal switching circuit 23, and address control over the IC memories 19 and 20, based on the instuction data inputted at the input section 2, pre-stored control program and data transmitted from the built-in memory circuit (not shown) in the following manner.

When the input section 2 is operated so that one of the digital speech data groups desired to be reproduced is selected, the control circuit 21 operates to switch the signal switching circuit 23 to the first state wherein the IC memory 19 is effected, based on the instruction data supplied from the input section 2. The control circuit 21 further operates to display the title of the speech data selected (specified by a key word in the sentence corresponding to the selcted speech data) on the LCD 4 and orders the signal processing circuit 22 to execute the D/A conversion operation. The signal processing circuit 22 reads out the selected digital speech data from the IC memory 19 and synthesizes analog speech signal Sa from the digital speech data Se, thereby supplying the signal Sa to the amplifying circuit 17. The reproduced speech is thus outputted from the earphone 8. Upon completion of reproduction of speech selected, the signal processing circuit 22 produces and end signal, which is supplied to the control circuit 21. The control circuit 21 operates to switch the signal switching circuit 23 to the second state wherein the IC memory 20 is effected, and to order the signal processing circuit 22 to execute the D/A conversion operation. The signal processing circuit 22 then reads out, from the IC memory 20, the digital speech data forming a counterpart to the speech data previously reproduced and synthesizes an analog speech signal Sa from the digital speech data Se, thereby supplying the signal Sa to the amplifying circuit 17. Then, the reproduced speech is outputted from the earphone 8. Upon completion of the reproduction of the speech, the signal processing circuit 22 produces an end signal which is supplied to the control circuit 21. The control circuit 21 operates to reiterate the reproduction of each speech by the number of times previously set by operation of the input section 2.

According to the second embodiment, the learner can continuously listen to the sentences corresponding to each other in the two languages (a foreign language and the mother tongue, in the embodiment). Furthermore, the learner can listen to the sentences selectively and by a desired number of times. Consequently, the practice of speaking the foreign language may be efficiently done with the sentence of the foreign language compared to the translated mother tongue sentence. The effects achieved in the first embodiment is also attained in the second embodiment.

Although the two IC memories 19 and 20 are employed for storing the two kinds of speech data groups in the above-described embodiment, a single IC memory may be used for storing two kinds of speech data groups. In this case, the IC memory stores identification codes of speech data groups forming a counterpart to each other so that the each identification code corresponds to its counterpart. The addresses of the speech data group to be read out may be sequentially selected based on the identification code. Furthermore, speech data of three or more languages may be stored at the IC memory of the external storage unit.

Although the invention is applied to reproduction of human speech in the foregoing embodiments, the invention may be applied to reproduction of other sounds.

The foregoing disclosure and drawings are merely illustrative of the principles of the present invention and are not to be interpreted in a limiting sense. The only limitation is to be determined from the scope of the appended claims.

What is claimed is:

1. A portable language learning device comprising:
   A) a card-shaped external storage unit incorporating a built-in integrated circuit memory for storing first digitized speech data corresponding to speech of at least two languages, respectively, said speech of said two languages representing contents corresponding to each other, said built-in memory including a plurality of first memory areas for storing said first digitized speech data in units of speech and a plurality of second memory areas for storing speech identification data corresponding to start addresses of said first memory areas, respectively; and
   B) a case to which said external storage unit is detachably attached, said case enclosing a reproduction unit comprising
      a) an input section including a plurality of operation switches each manually operated such that a selecting signal is produced;
      b) a control section encoding said selecting signal produced from said input section, said control section controlling said device so that said speech identification data corresponding to an encoded selecting signal is retrieved and said first digitized speech data corresponding to retrieved data and represented in said two languages is alternately read out from said memory continuously;
      c) a signal processing circuit sequentially synthesizing analog speech signals from said first digitized speech data read out by said control section from said built-in memory;
      d) an amplifying circuit amplifying said analog speech signals synthesized by said signal processing circuit; and e) output means for producing speech based on said speech signals amplified by said amplifying circuit.

2. A portable language learning device as claimed in claim 1, wherein said reproduction unit further comprises display memory means for storing a title assigned to each of said speech data, displaying means for displaying said title and a control circuit for controlling said displaying means so that said title is read out from said display memory means and displayed by said displaying means at the time of corresponding speech.

3. A portable language learning device as claimed in claim 1, wherein said reproduction unit further comprises:

microphone means for supplying analog speech signals to said signal processing circuit;

an internal integrated circuit memory for storing second digitized speech data; and said input section includes a manually operated signal switching circuit for selectively connecting said signal processing circuit to either said internal memory or said built-in memory;

wherein said signal processing circuit functions to convert said analog speech signals supplied from said microphone means to second digitized speech signals, and to transfer said second digitized speech signals to either said internal memory or said built-in memory for storage therein, said signal processing circuit further functioning to synthesize analog speech signals based on speech data read out from either of said memories.

4. A portable language learning device as claimed in claim 1, wherein said reproduction unit further comprises retrieving means for retrieving a capacity of an unstored location of each storage area of either said internal memory or said built-in memory to determine a total time period with respect to said capacity of said unstored location and display means for displaying time period data.

5. A portable language learning device comprising:

A) a card-shaped external storage unit incorporating a built-in integrated circuit memory for storing digitized speech data corresponding to speech of at least two languages, respectively, said speech of said at least two languages representing contents corresponding to each other, said built-in memory including a plurality of first memory areas for storing said digitized speech data in units of speech and a plurality of second memory areas for storing speech identification data corresponding to input start addresses of said first memory areas, respectively; and B) a case to which said external storage unit is detachably attached, said case enclosing a reproduction unit comprising a) microphone means for supplying input analog speech signals;

b) an internal integrated circuit memory for storing digitized speech data;

c) an input section including a plurality of operation switches each manually operated such that a selecting signal is produced;

d) a control section encoding said selecting signal produced from said input section, said control section controlling said device so that said speech identification data corresponding to encoded selecting data is retrieved and first digitized speech data corresponding to retrieved data and represented in said two languages is alternately read out from said internal memory continuously;

e) a signal processing circuit comprising first means for converting said input analog speech signals into input digitized speech data and second means for converting read-out digitized speech data into synthesized analog speech signals;

f) an input section including a manually operated signal switching circuit for selecting either said first means or said second means such that upon selection of said first means said switching circuit transfers said input digitized speech data for storage in said internal memory and upon selection of said second means said switching circuit sequentially transfers read-out digitized speech data from said built-in memory or from said internal memory to said second means for conversion to synthesized analog speech signals;

g) an amplifying circuit amplifying said synthesized analog speech signals supplied from said signal processing circuit;

h) output means for producing speech based on said synthesized analog speech signals amplified by said amplifying circuit;

i) first control means for providing data titles corresponding, respectively, to said speech identification data from said built-in memory;

j) first display means for respectively displaying said data titles in conjunction with said synthesized analog speech signals;

k) second control means including retrieving means for retrieving a capacity of an unstored location of each storage area of either said internal memory or said built-in memory to determine a total time period with respect to said capacity of said unstored location; and l) second display means for displaying said time period data.

* * * * *